Feb. 11, 1969 C. J. CAMPAGNUOLO 3,426,783

HIGH IMPEDANCE DIGITAL AMPLIFIER

Filed April 26, 1967

INVENTOR,
CARL J. CAMPAGNUOLO
BY Harry M. Saragovitz,
Edward J. Kelly, Herbert Berl
& Peter J. Cobrin United States Patent Office 3,426,783

Patented Feb. 11, 1969

3,426,783

HIGH IMPEDANCE DIGITAL AMPLIFIER

Carl J. Campagnuolo, Chevy Chase, Md., assignor to the United States of America as represented by the Secretary of the Army Filed Apr. 26, 1967, Ser. No. 634,809
U.S. Cl. 137—81.5 6 Claims
Int. Cl. F15c *1/00*

ABSTRACT OF THE DISCLOSURE

A digital fluid amplifier is provided with high impedance characteristics by having a slot communicate part of the fluid in the output channel with the control channel. The fluid in the control channel is vented to atmosphere creating a low pressure region in the interaction chamber adjacent the control channel. This draws the power stream to the side wall adjacent the control channel improving the lock-on of the power stream to the side wall. The fluid exhausting from the control channel to atmosphere provides high impedance characteristics for the fluid amplifier and improves the gain thereof.

*Background of the invention*

Fluid amplifier systems have only recently been invented, and because of their inherent advantages over mechanical systems which employ moving parts, have been finding wide-spread use. Essential to every fluid amplifier system is the amplifier. There are basically two types of fluid amplifiers. The first type of fluid amplifier is called a proportional amplifier. In this type of amplifier a high energy stream is continuously varied between a plurality of output channels by a low energy signal. The second type of fluid amplifier, known as the bistable type, has a high energy fluid stream directed to only one of a plurality of output channels. In this type of fluid amplifier the high energy stream cannot be continuously varied between several of the output channels by the low energy stream. This invention is concerned with a bistable amplifier and means for improving the gain of said amplifier and also for making the amplifier a high impedance digital device. Prior art bistable fluid amplifiers had a gain of usually less than ten (10) and a low input impedance. Because of the low input impedance and small gain it was usually necessary to stack several of these devices in series in order to obtain a usable gain. The present invention provides a digital fluid amplifier with high impedance and a much higher gain than was previously obtainable with prior art bistable fluid amplifiers. A digital amplifier built in accordance with the present invention should be able to have a gain of approximately fifteen (15), which would be a significant improvement over the gain obtainable in the prior art bistable fluid amplifiers.

It is therefore an object of this invention to provide a bistable fluid amplifier with a gain greater than that of prior art bistable fluid amplifiers.

A further object of the present invention is to provide a bistable fluid amplifier with a high input impedance thus capable of being operated and controlled by low pressure signals.

Still another object of the present invention is to provide a bistable fluid amplifier with a high impedance input receiving means in one control channel and a low input impedance receiving signal means in the other control channel.

*Summary of the invention*

Briefly, in accordance with the present invention, a slot communicates part of the power fluid in the interaction chamber with a control channel. The fluid in the control channel is vented to atmosphere creating a low pressure region in the control channel adjacent the interaction chamber, thus increasing the lock-on effects of the power fluid in the interaction chamber on the side wall adjacent the control channel. Due to the fluid exhausting from the control channel to atmosphere, the bistable amplifier will have a high impedance.

*Description of the preferred embodiments*

Figure 1:
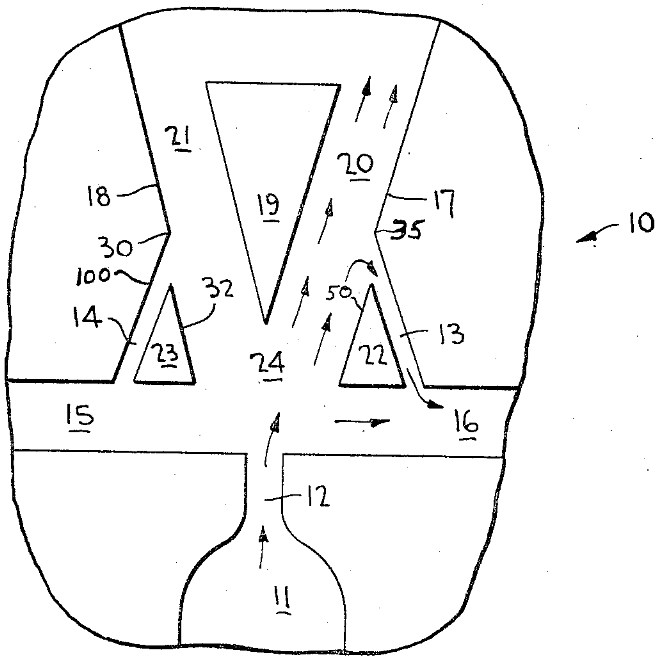
FIGURE 1 is a schematic representation of an embodiment in accordance with the present invention.

In FIGURE 1, a high impedance digital amplifier 10 is shown having a power port 11 and a power nozzle 12 in communication with the power port. Positioned downstream of power nozzle 12 is an interaction chamber 24. Communicating with interaction chamber 24 is a left control channel 15 of constant cross-sectional area and a right control channel 16, also of constant cross-sectional area. As can be seen from FIGURE 1, control channels 15 and 16 are aligned with each other. Interaction chamber 24 is bounded on the left side by two side walls, a side wall 32 of a triangular splitter 23 and a side wall 18. A splitter 19 extends to interaction chamber 24 and along with side wall 18 defines a left output passage 21. A splitter 22 is formed on the right side of interaction chamber 24 and is symmetrically placed with respect to the interaction chamber and splitter 23. A right side wall 17 along with splitter 19 serves to define a right output passage 20. It can be seen from FIGURE 1, that side wall 32, and side wall 18 are not in alignment with each other. If side wall 18 were extended into the interaction chamber, side wall 32 would be slightly to the left thereof.

A slot 14 communicates left output passage 21 and left control channel 15. A cusp 30, formed at the end of left side wall 18 closest to power nozzle 12, insures that part of the power fluid from nozzle 12 directed to left output passage 21 will be directed to slot 14 and from there to left output channel 15. Cusp 30 and channel 15 are joined by wall 100. The right side of digital amplifier 10 is identical to and symmetrical with the left side of the amplifier and operates in the same manner.

Figure 2:
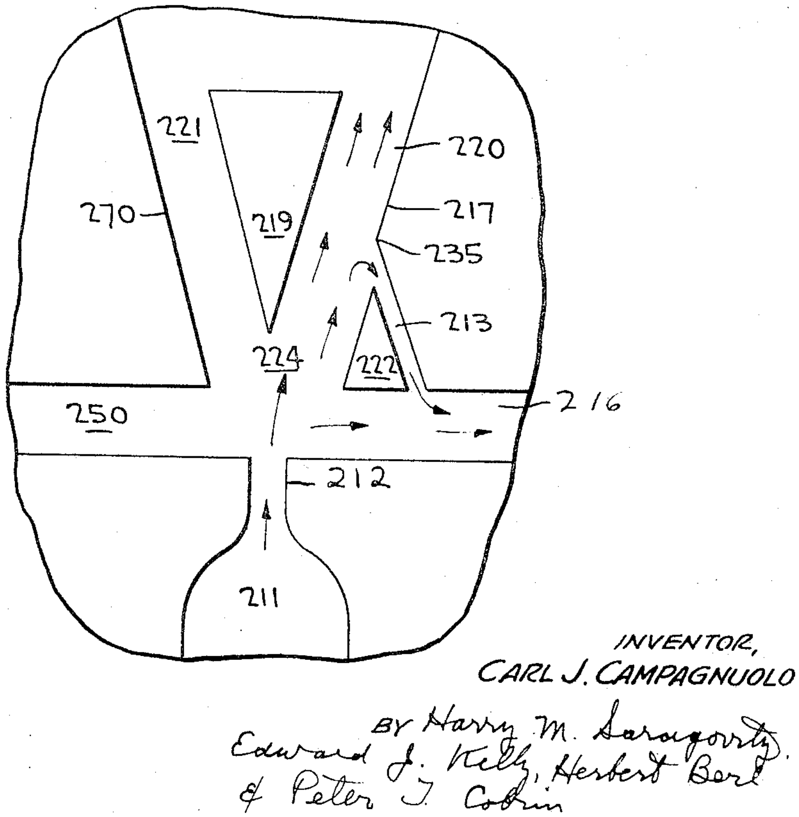
FIGURE 2 is a schematic representation of a modified embodiment of the invention as illustrated in FIGURE 1.

In FIGURE 2 elements identical to FIGURE 1 have the same last two numerals only prefaced by a number 2. In FIGURE 2 I have modified the invention of FIGURE 1 by having the right side of the amplifier shown in FIGURE 1 to be of a high impedance input type, while the left side thereof is a conventional low impedance input. In FIGURE 2 the left control channel 250 is the conventional type having a constant cross-sectional area. A left side wall 270 and a splitter 219 serve to define a left output passage 221. The right side of the amplifier of FIGURE 2 and in particular the right control channel and a right slot 213 are identical to the right side of the amplifier of FIGURE 1.

*Operation*

When power fluid is supplied to power port 11 of the amplifier of FIGURE 1 and a power jet is formed by power nozzle 12, the power fluid will attach to either left side wall 18 or right side wall 17 in accordance with principles well known in the art. For the purposes of illustration it is assumed that the power jet is attached to the right side wall 17 and a majority of the power jet is issuing from right output passage 20 as seen in FIGURE 1. Because side walls 17 and 50 are not in alignment with each other and due to cusp 30, part of the power jet directed to right output passage 20 will be directed to right slot 13 and to atmosphere via control channel 16. Fluid flowing from slot 13 to atmosphere by control channel 16 will tend to entrain fluid from the region of control channel 16 adjacent interaction chamber 24. This will lower the pressure in the region of control channel 16 adjacent interaction chamber 24 increasing the lock-on of the power jet issuing from nozzle 12 to side wall 17 thus making the amplifier less amenable to switching from back pressures downstream of passage 20. If it is desired to switch the amplifier, there are a number of ways of doing it. Since this is a high impedance amplifier, only a low pressure signal at control channel 16 would be necessary to switch the amplifier. A low pressure signal at control channel 16 would stop the flow from slot 13 venting to atmosphere and create a build-up of fluid in control channel 16 which would be directed to interaction chamber 24to act against the power jet issuing from power nozzle 12 and switch the latter to left output passage 21. Another method of switching the digital amplifier of FIGURE 1 would be merely to place a finger over the end of control channel 16 to cause the fluid in the control channel to back up towards the interaction chamber and thus switch the power jet to left output passage 21. A third way to switch the amplifier of FIGURE 1 would be to place a finger over the end of control channel 15. This would create a low pressure region in the part of control channel 15 adjacent the interaction chamber due to the entrainment effects of the fluid in control channel 15 from the power jet issuing into interaction chamber 24. When the pressure in control channel 15 adjacent interaction chamber 24 is lower than the pressure in control channel 16 adjacent interaction chamber 24, the power jet issuing from power nozzle 12 into interaction chamber 24 will switch because of the pressure differential applied thereacross. Because of the low pressure signal needed to switch the amplifier due to the high impedance in each control channel, which is a result of fluid flowing thereto from slots 13 and 14, a high gain can be obtained.

In FIGURE 2 operation of the amplifier shown therein is identical to the operation of the amplifier shown in FIGURE 1 except that right control channel 216 is of the high impedance type due to flow therein from slot 213 while left control channel 250 is of the low impedance type due to the lack of flow from the power jet being directed thereto. If power fluid from power jet 212 is directed to right output passage 220 as shown, a low pressure signal in right control channel 216 will be necessary to switch the power jet to left output passage 221. If the power fluid is directed to left passage 221 a high pressure signal will be necessary to switch the power fluid to right passage 220 in accordance with principles well known in the art. The reason that left control channel 250 is of a low impedance type is that none of the power fluid from power jet 212 is directed thereto. When part of the power fluid from the power jet is directed to the control channel, a small pressure signal in the control channel will cause the power fluid to back up to the interaction chamber switching the power jet. This phenomena will occur with right control 215 of the amplifier of FIGURE 2 due to slot 213 but will not occur in left control channel 250 since now power fluid is directed there.

It is necessary in designing an amplifier in accordance with this present invention to insure that the slots are positioned so that the power fluid is directed into the control channels away from the interaction chamber. If the power fluid were directed to the control channels and to the interaction chamber oscillation of the power fluid would occur.

It will be apparent that the embodiments shown are only exemplary and that various modifications can be made in construction and arrangement within the scope of the invention as defined in the appended claims.

I claim:

1. A fluid amplifier comprising:

(a) means to issue a power jet, (b) an interaction chamber to receive said power jet, (c) a first output passage and a second output passage to selectively receive said power jet from said interaction chamber, (d) a first control channel adjacent said interaction chamber and a second control channel opposite said first control channel and also adjacent said interaction chamber, and (e) means communicating said first output passage and said first control channel to direct fluid into said first control channel in a direction away from said interaction chamber thereby entraining fluid from the region of said first control channel adjacent said interaction chamber.

2. A device according to claim 1 wherein a first side wall and a splitter define said first output passage, and a second splitter is positioned adjacent said interaction chamber and has one side parallel to said first side wall and is slightly further away from said splitter than said first side wall.

3. A device according to claim 2 wherein a second wall is integral with said first control channel and said first output passage, and said second wall and said second splitter define said means communicating said first output passage and said first control channel.

4. A device according to claim 3 wherein said means comprise a slot.

5. A device according to claim 4 wherein said second splitter has three sides, one of said sides being parallel to said first side wall, another of said sides serves to define along with said second wall said slot, and a third side serves to help define said first control channel.

6. A device according to claim 5 wherein a second side wall and said splitter define said second output passage and said second side wall extends to said second control channel.

References Cited

UNITED STATES PATENTS

| | | | |
|---|---|---|---|
| 3,292,623 | 12/1966 | Warren | 137—81.5 X |
| 3,361,149 | 1/1968 | Meyer | 137—81.5 |

M. CARY NELSON, *Primary Examiner.*

WILLIAM R. CLINE, *Assistant Examiner.*